United States Patent [19]

Kimura

[11] Patent Number: 4,918,702
[45] Date of Patent: Apr. 17, 1990

[54] LASER UNIT

[75] Inventor: Akiyoshi Kimura, Kawasaki, Japan

[73] Assignee: Canon Kabushiki Kaisha, Tokyo, Japan

[21] Appl. No.: 277,545

[22] Filed: Nov. 29, 1988

[30] Foreign Application Priority Data

| Dec. 2, 1987 | [JP] | Japan | 62-304919 |
| Dec. 2, 1987 | [JP] | Japan | 62-304920 |
| Dec. 26, 1987 | [JP] | Japan | 62-331554 |
| Dec. 26, 1987 | [JP] | Japan | 62-331555 |
| Dec. 26, 1987 | [JP] | Japan | 62-331556 |
| Dec. 26, 1987 | [JP] | Japan | 62-331557 |
| Dec. 26, 1987 | [JP] | Japan | 62-331558 |
| Jan. 20, 1988 | [JP] | Japan | 63-8498 |
| Aug. 25, 1988 | [JP] | Japan | 63-209430 |

[51] Int. Cl.$^4$ .............................................. H01S 3/04
[52] U.S. Cl. ..................................... 372/34; 372/108; 372/107; 372/101
[58] Field of Search ..................... 372/34, 103, 43, 24, 372/65, 107, 108, 101

[56] References Cited

U.S. PATENT DOCUMENTS

| 4,661,959 | 4/1987 | Kaneko | 372/24 |
| 4,672,258 | 6/1987 | Konishi | 313/15 |
| 4,726,648 | 2/1988 | Haberland et al. | 350/96.20 |
| 4,763,334 | 8/1988 | Shimada et al. | 372/43 |

Primary Examiner—Léon Scott, Jr.
Attorney, Agent, or Firm—Fitzpatrick, Cella, Harper & Scinto

[57] ABSTRACT

A laser unit includes a laser source for emitting a laser beam, a collimator lens for collimating the laser beam emitted from the laser source, a supporting member, made of a good thermal conductivity material, for supporting the laser source, and a heat insulating layer disposed between the supporting member and the collimator lens.

41 Claims, 12 Drawing Sheets

LASER UNIT

FIELD OF THE INVENTION AND RELATED ART

The present invention relates to a laser unit usable with an apparatus using a collimated laser beam, such as a laser beam printer and a compact disk player.

In an apparatus using a laser beam, a laser source and a collimator lens have been constituted as a unit because the size of the laser source becomes smaller, particularly owing to use of a semiconductor laser element.

The problem with such a laser unit is that the laser unit can be thermally expanded due to change in the ambient temperature or the like with the result that the distance between the laser source and the collimator lens changes so that the laser beam is not correctly collimated. Particularly, the semiconductor laser element is easily raised in temperature, and therefore, a holder constituting the laser unit has been made of a metal having good thermal conductivity.

U.S. Pat. No. 4,297,713, for example, discloses that the holder is made of a metal having a small thermal expansion property, and simultaneously, the laser element is cooled in order to reduce the influence of the thermal expansion and the temperature rise.

An example of a laser unit having a semiconductor laser element and a collimator lens will be described.

Referring first to FIG. 4, the example of the laser unit is shown in cross-section. A laser beam emitting chip 102a is contained in a laser package 102 fixed on a laser base 101 by a laser package holder 100. The laser beam emitted therefrom is directed to an unshown polygonal mirror or the like through a collimator lens 104 coaxially mounted in a collimator lens barrel 103. The collimator lens barrel 103 for supporting the collimator lens 104 is supported by a barrel holder 105 provided around the outer periphery of the barrel 103, and the barrel holder 105 is mounted on the laser package holder 100. Thus, in order to mount the collimator lens 104 on the laser base 101, an assembly constituted by three members, i.e. the collimator lens barrel 103, the barrel holder 105 and the laser package holder 100 is used. By doing so, the laser package 102 is maintained perpendicular to the optical axis, and the gap between the collimator lens 104 and the beam emitting chip 102a is adjustable, and further, the light emitting central axis of the laser beam and the optical axis of the collimator lens 104 are aligned.

In order to enhance the heat radiation effect during the laser beam emission, the metals having high thermal conductivity are used, more particularly, the laser package holder 100 and the barrel holder 105 are made of aluminum, and the collimator lens barrel 103 is made of steel plated with nickel for rust proof.

Since the collimator lens barrel 103, the barrel holder 105 and the laser package holder 100 are made of metals which are good in thermal conductivity, the temperature of the collimator lens barrel 103 rapidly changes when an abrupt change, decrease for example, of the temperature occurs. As a result, the temperature of the collimator lens 104 supported by the barrel 103 rapidly changes with a possible result of moisture condensation on the surfaces 104a and 104b of the lens. When the laser beam is emitted with the collimator lens 104 with the condensed moisture, the beam is scattered, whereupon a quality of the image is deteriorated when the laser beam is used in a printer or the like.

SUMMARY OF THE INVENTION

Accordingly, it is a principal object of the present invention to provide a laser unit in which the moisture condensation does not occur on the collimator lens even when the ambient temperature changes abruptly.

It is another object of the present invention to provide a laser unit wherein the distance between the laser chip and the collimator lens can be maintained substantially constant even when the ambient temperature changes.

It is a further object of the present invention to provide a laser unit wherein the barrel of the collimator lens is made of a resin material.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
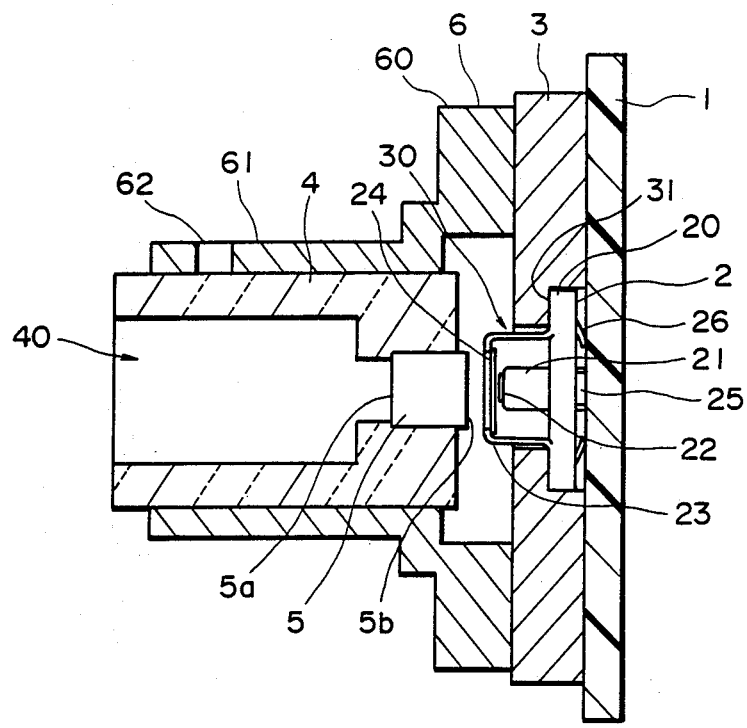
FIG. 1 is a sectional view of a laser unit according to an embodiment of the present invention.

Embodiments of the present invention will be described in conjunction with accompanying drawings wherein like reference numerals are assigned to the corresponding elements.

Referring now to FIG. 1, there is shown a laser unit according to an embodiment of the present invention. The laser unit comprises a laser base 1 for maintaining a constant quantity of the laser beam, which is made of a resin material, and a package holder 3 mounted on the laser base 1. The package holder 3 includes a laser package 2 for emitting the laser beam and a assembly for supporting the laser package 2. The laser package 2 is provided with a package base 20, on which a cylindrical base member 21 made of copper and functioning as a heat sink is mounted. On the cylindrical base member 21, a laser beam emitting chip 22 is mounted. On the package base 20, a cover 23 for protecting the base member 21 and the emitting chip 22 from dust or the like is mounted. In front of the emitting chip 22, there is a transparent cover glass 24. The bottom of the package base 20 is provided with a projection 25 in abutment with the laser base 1, and a spring washer is inserted between the package base 20 and the laser base 1. By this, the laser package 2 is finely adjustable in angle relative to the laser base 1.

The package holder 3 is generally in the form of a disk and is made of zinc (Zn) having a thermal conductivity of 96 KCal/mh °C. It has a central opening 30 having different inside diameter portions, so that the laser package 2 is fitted in the opening 30, and so that an engaging surface 31 of the opening 30 is in surface contact with the upper surface of the package base 20 of the laser package 2. Therefore, when the package holder 3 is mounted to the laser base 1, the laser package 2 is abutted to the engagement surface 31 of the package holder 3 by the spring washer 26, and therefore, the correct positioning is accomplished, that is, the laser package 2 is mounted normally to the optical axis. The package holder 3 is securely mounted to the laser base 1 by plural screws not shown.

A collimator lens barrel 4 is a supporting assembly for supporting a collimator lens 5 made of glass, and is fixedly mounted to the package holder 3 by a lens barrel holder 6 which is a supporting assembly provided outside the lens barrel 4 and coaxially therewith. A base portion 60 of the barrel holder 6 is securely fixed to the package holder 3 at a predetermined position by unshown plural screws penetrating the laser base 1, and a bonding agent is filled in a bonding agent bore 62 formed in a cylindrical portion 61 of the holder 6, by which the collimator lens barrel 4 is fixed on the inside surface of the holder 6. The material of the barrel holder 6 is zinc (Zn). Adjacent an end of the collimator lens barrel 4 near the emitting chip 22, a collimator lens 5 is coaxially mounted, and the other end of the barrel 4 is opened as designated by a reference 40. Because of this arrangement, during assembling of the unit, the position of the holder 6 is adjusted relative to the package holder 3 by the screws to align the laser beam and the optical axis of the collimator lens 5 and to make adjustment in X-Y directions; and the position of the collimator lens barrel 4 is adjusted relative to the barrel holder 6 to adjust the ga between the emitting chip 22 and the collimator lens 5.

In this embodiment, the collimator lens barrel 4 which is functionally between the collimator lens and the package holder 3 having good thermal conductivity, is made of a resin material having a high thermal insulating property, thus substantially isolating the lens from an abrupt change in the ambient temperature, whereby the moisture condensation on the collimator lens surfaces 5a and 5b is prevented. A proper resin material of the collimator lens barrel 4 is PES resin (polyethersulfone). The thermal conductivity of the PES material is $1.5 \times 10^{-1}$ KCal/mh °C., which is fairly lower than that of steel (50 KCal/mh °C. approximately) which has been used as a material for the collimator lens barrel, and therefore, the temperature change resulting from an abrupt change of the ambient temperature is not easily conducted to the collimator lens 5.

As for a material other than the resin material for the collimator lens barrel 4, a low conductivity ceramic material, such as zirconia ($ZrO_2$) ceramics having a thermal conductivity of 1.8 KCal/mh °C., is usable.

Figure 2:
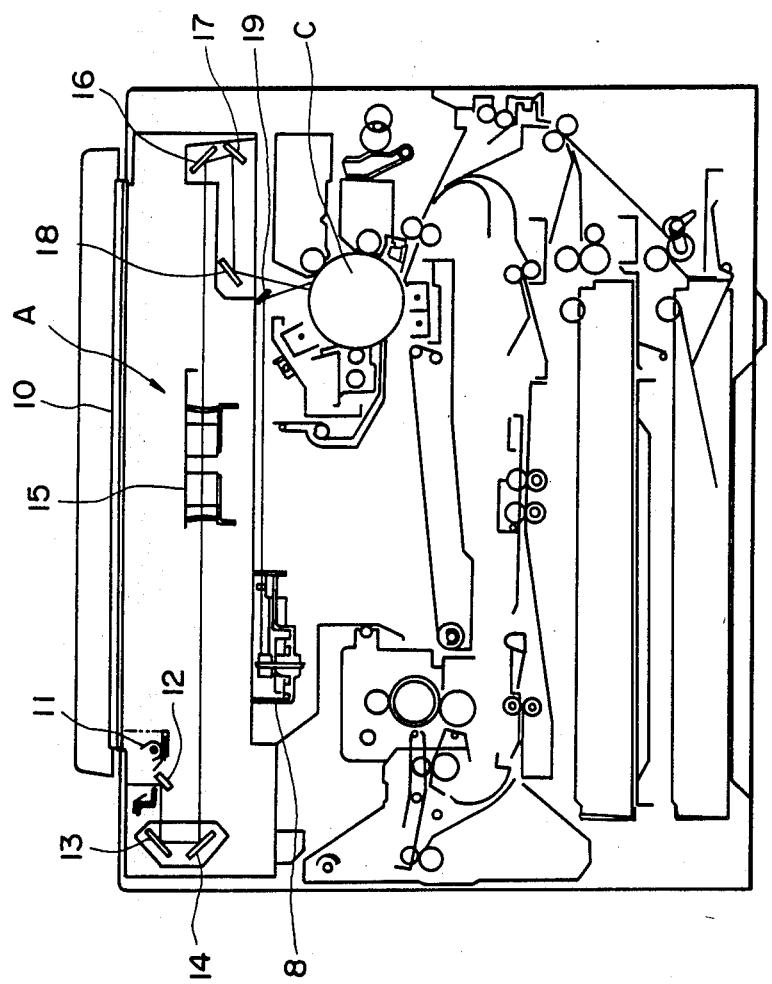
FIG. 2 is a sectional view of a laser recording apparatus which can be used with the laser unit according to an embodiment of the present invention.

FIG. 2 shows an image forming apparatus using the laser unit according to the embodiment. The image forming apparatus comprises a first optical system A, a second optical system B and a photosensitive drum C.

The first optical system A includes a lamp 11 for illuminating an original placed on an original supporting platen 10, mirrors 12, 13 and 14, a lens 15 and mirrors 16, 17 and 18. The light reflected by the original is directed to the photosensitive drum C by way of mirrors 12, 13 and 14, through the lens 15 and by way of the mirrors 16, 17 and 18.

Figure 3:
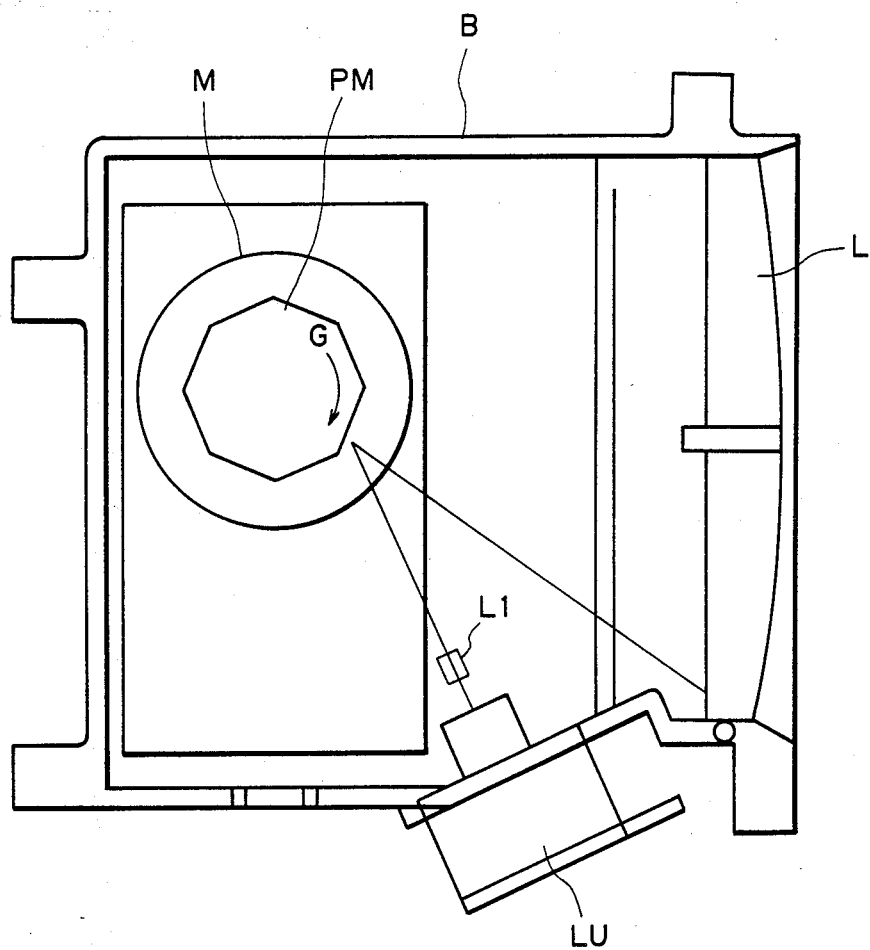
FIG. 3 is a top plan view of a laser optical system of a laser unit according to an embodiment of the present invention.

As shown in FIG. 3, the second optical system B includes a laser unit LU, a cylindrical lens L1, a motor M, a rotatable mirror in the form of a polygonal mirror PM in this embodiment connected with the motor M and rotatable in a direction indicated by an arrow G, a toric lens (F-$\theta$ lens) L. The laser beam emitted from the laser unit LU is scanningly deflected by the polygonal mirror PM and is directed to the photosensitive drum C through the toric lens L and the mirror 19.

Examples of functions of the laser unit LU according to the embodiment of the present invention in the image forming apparatus will be described. First, the laser unit LU may be connected to an output port of a computer, a word processor or the like and may be made to function as a latent image forming means, wherein an image combined with an image formed by the first optical system is produced. Secondly, it is used for forming a blank at a leading edge of the image or for dissipating unnecessary electric charge in an area on the photosensitive drum 3 which corresponds to a space between an image transfer sheet and a next image transfer sheet. Thirdly, it may be used for masking and/or trimming function by using it with a coordinate input means such as digitizer or the like to erase unnecessary portion of an image of an original formed by the first optical system 1. As a fourth example, it may be used for add-on function for adding information not included in the original, such as a date or a page number in a portion provided by blocking a part of the optical path of the first optical system.

In any of the above examples, a high parallelism is required between major scanning direction of the scanning beam from the laser unit LU and the generating line of the photosensitive drum C. In the examples wherein the laser unit LU is used with analog image exposure through the first optical system A for the purpose of functions of trimming, masking and add-on functions, a high parallelism is always required for the scanning beam relative to the incident beam from the first optical system A, as well as relative to the generating line of the photosensitive drum C.

In this embodiment, since the collimator lens barrel 4 is made of resin, ceramic or the like material having a high heat insulative property, the moisture condensation on the collimator lens 5 can be avoided even if the ambient temperature abruptly changes, so that the deterioration of the image quality due to the laser beam scattering can be prevented, thus providing always a high quality image. In addition, the package holder 3 for holding the laser package 2 is made of a metal, more particularly, zinc, and therefore, the heat produced in the laser package 2 during the laser beam emission can be sufficiently radiated.

In this embodiment, the collimator lens barrel 4 is made of a resin or ceramic material, but another material is usable as long as the thermal conductivity thereof is so low that the change in the ambient temperature is not easily conducted to the collimator lens 5. However, resin material is considered as best from the standpoint of easiness in the manufacturing of the laser unit.

The portion made of the heat insulative material is not limited to the collimator lens barrel 4, but a heat insulative material may be incorporated in a part of the collimator lens barrel 4, and alternatively, the barrel holder 6 may be made of resin material to increase the heat insulative effect. This is so, as long as the heat radiation effect from the laser unit LU and the heat insulation effect of the collimator lens 5 from the ambient temperature change, are assured. Since, however, the temperature change preventing effect of the collimator lens 5 is most significant when the collimator lens barrel 4 is made of a heat insulating member, it is preferable that at least the collimator lens barrel 4 is made of a heat insulative material. The heat radiating member for radiating heat from the laser package 2 is not limited to the package holder 3, but in view of the heat radiation effect thereof, it is preferable that at least the package holder 3 is a heat radiating member.

In the foregoing description, the laser beam emitted from the laser unit LU has been described as being used with a copying machine in which an image combined with an original image is formed to provide a blank or the like, but the present invention is not limited to this, and is usable with another apparatus such as a laser beam printer.

Referring to FIGS. 5–8, another embodiment of the present invention will be described, wherein a reference LU generally designates a laser unit. The laser unit LU includes a semiconductor laser chip 22 and a collimator lens 5 mounted as a unit by a mounting members 27 with a predetermined gap G therebetween.

The mounting members 27 include a first holder 7 cooperative with the laser base 6 to support the laser package 2 having a laser chip 22, a collimator lens barrel 8 for holding the collimator lens 4 and a second holder 9 for connecting the first holder 7 and the collimator lens barrel 8.

The laser chip 22 is mounted to an end of a base member 21 made of a metal such as copper having a high thermal conductivity and is accommodated in a casing or cover 23 having a hat-like cross section to be constituted as a unit of a laser package 2. In a front end of the cover 23, an opening 24a is formed for permitting emission of the laser beam, and the opening 24 is covered with a cover glass 24. The base end of the cover 23 is formed into an annular flange 20 extending outwardly in the radial direction.

The first holder 7 is a plate member made of a zinc die-cast having a central hole 7a for receiving the cover 23 of the laser package 2 wherein the laser package 2 is supported perpendicularly to the optical axis to align the emission angle of the laser beam from the laser chip 22 with the optical axis. More particularly, a reference step 31 is formed in the bore 7a of the first holder 7 adjacent the laser base 6 to be abutted by the flange 20c of the package base 20 of the laser package 2. By the abutment of the flange 20c to the step 31, the mounting angle of the laser package 2 is determined. Between the laser package 2 and the laser base 3, a spring washer 26 is inserted to press-contact the flange 20c to the step 31.

The second holder 9 is in the form of a cylinder and is made of a zinc die-cast, similarly to the first holder 7. The second holder 2 is constituted by a cylindrical barrel supporting portion 91 for receiving in its inside the collimator lens barrel 8 and a mounting flange 92 for fixing it to the first holder 7. By moving the second holder 9 in a direction perpendicular to the optical axis, the central axis of the laser beam emission from the laser chip 22 and the optical axis of the collimator lens 5 can be adjusted.

Figure 8:
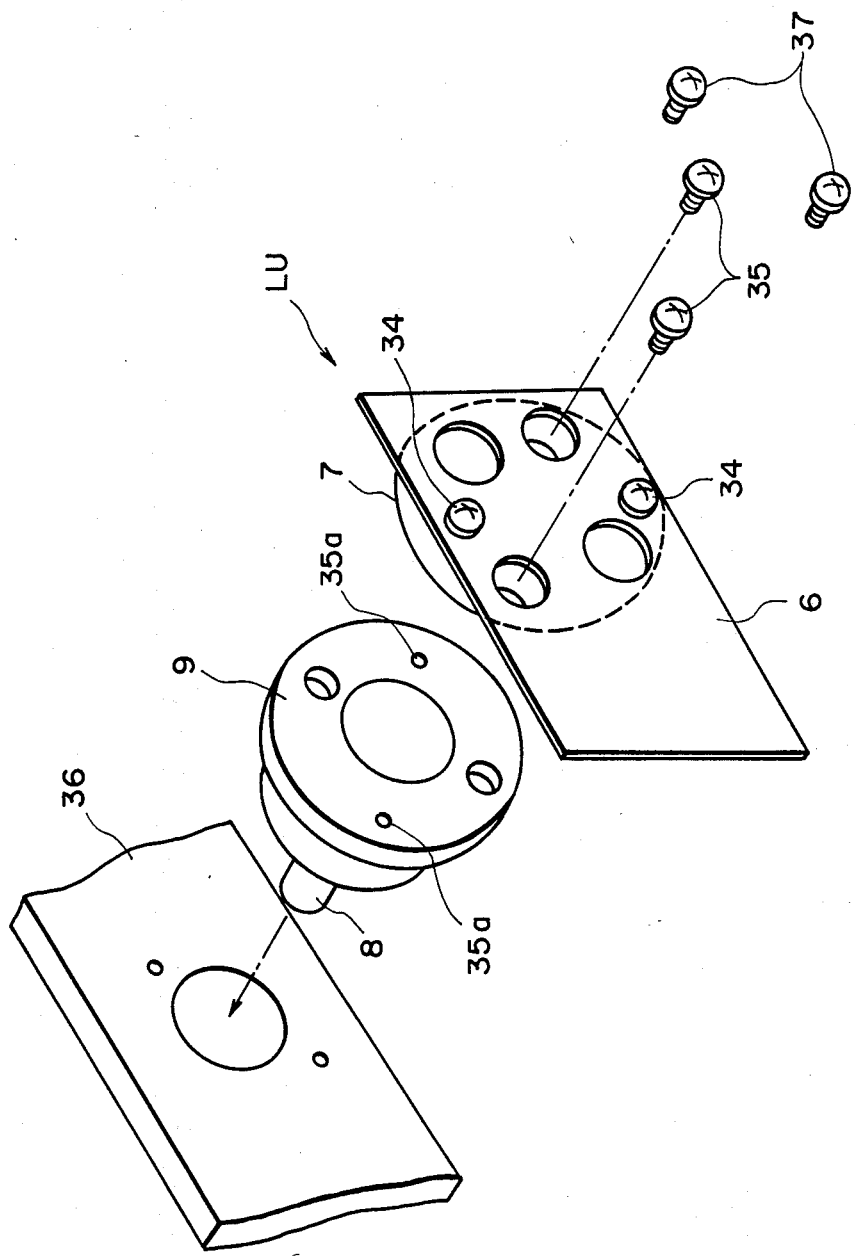
FIG. 8 is an exploded perspective view of a laser unit illustrating assembling thereof.

Referring to FIG. 8, the coupling among the first holder 7, the second holder 9 and the laser base 6 is accomplished by screws 34 and 35. Firstly, the laser base 6 and the first holder 7 are secured by threading screws 34 into first threaded bores 34a of the first holder 7 from the laser base 6 side. The second holder 9 is fixed to the first holder 7 by threading screws 35 into threaded bores 35a of the second holder 9 from the laser base 6 side through through bores 35b of the first holder 7 (formed in addition to the first bores 34a). The adjustment for the axial alignment is possible by the clearances between the through bores 35b of the first holder 7 and the associated screws 35. The laser unit LU is mounted to a mounting member 38 by threading screws 37 from the laser base side 6.

The collimator lens barrel 8 is made of a resin material containing a base resin material and a filler material F for controlling a linear expansion coefficient.

The collimator lens barrel 8 is engaged into the parallel supporting portion 91 of the second holder slidably in the axial direction, and is bonded and fixed relative to the second holder 9 by a bonding agent filled into a bonding bore 81 formed in the barrel supporting portion 91 adjacent its end. The collimator lens barrel 8 has a length slightly larger than that of the parallel supporting portion 91, and the inside periphery thereof adjacent the end near the laser package 2 is formed into a lens mounting portion 82 having a large thickness. The collimator lens 5 is fixed to the lens mounting portion 82. The gap G between the collimator lens 5 and the laser chip 22 of the laser package 2 is adjusted by sliding the collimator lens barrel 8 along the optical axis, and after the adjustment, the collimator lens barrel 8 is bonded and fixed to the first holder 7.

The gap G between the collimator lens 5 and the laser chip 22 changes when the temperature changes, and the amount of the gap change is dependent on the thermal expansion differences among mounting members 27, more particularly, in this embodiment, the chip base 21, the first holder 7, the second holder 9 and the collimator lens barrel 8. The thermal expansions of the first and second holders 7 and 9 increase the gap G, whereas the thermal expansions of the chip base 21 and the collimator lens barrel 8 decreases the gap G. The overall change is a resultant change of the gap G.

Figure 6:
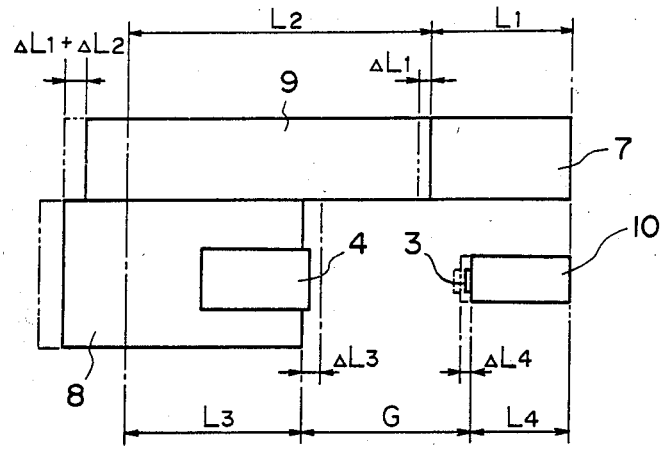
FIG. 6 illustrates thermal expansions of elements of a laser unit.
Figure 7:
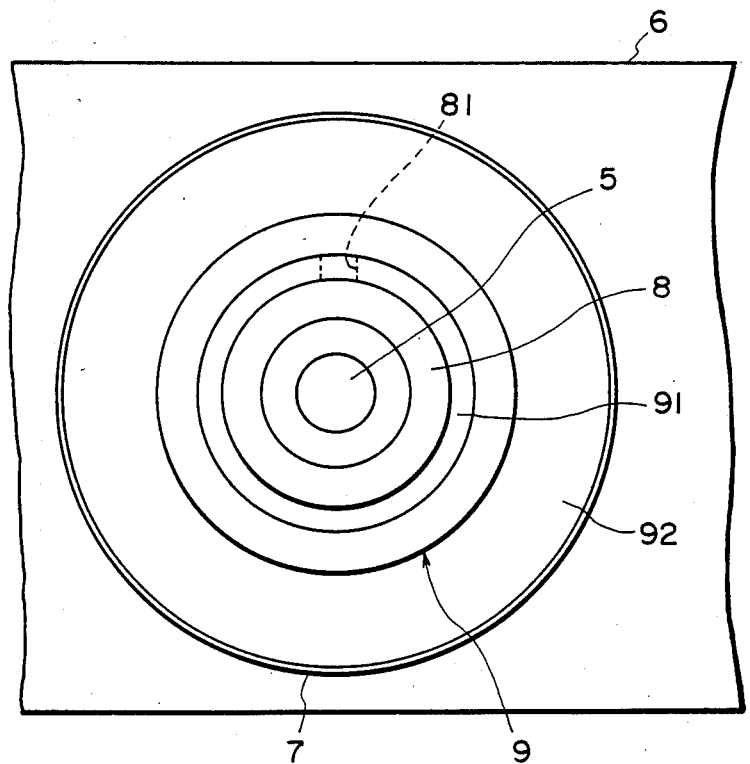
FIG. 7 is a front view of a laser unit according to an embodiment of FIG. 5.

FIG. 6 schematically illustrates the thermal expansions of the constituent elements influential to the gap G. The reference step 31 of the first holder 7 is taken as a reference surface. The dimensions influential to the change of the gap G are a distance L1 from the reference step 31 to the mounting surface of the second holder 9, a distance L2 from the mounting surface of the second holder 9 to the bonding bore 81, a distance L3 from the bonding bore 81 of the collimator lens barrel 8 to a laser chip side end surface thereof, and a distance L4 from the reference surface of the chip base 21 to the laser chip 22. The change $\Delta X$ is $(\Delta L1 + \Delta L2) - (\Delta L3 + \Delta L4)$ where $\Delta L1$, $\Delta L2$, $\Delta L3$ and $\Delta L4$ are thermal expansions of the dimensions L1, L2, L3 and L4, respectively.

The linear expansion coefficient of the material of the barrel 8 is so determined that the amount of the thermal expansion $\Delta L3$ results in the gap change $\Delta X$ within the depth of focus of the collimator lens 5.

As for the base resin material of the collimator lens barrel 8 is amorphous polyethersulfone (aromatic sulfone resin) (PES), crystalline polyphenylenesulfide material (PPS), and another resin material having a large linear expansion coefficient. Among those, the amorphous resin such as PES is advantageous in that the deterioration of the property against temperature rise is small, and therefore, it is durable to a severe conditions such as an abrupt temperature change.

On the other hand, the filler F preferably has a linear thermal expansion coefficient which is different from, particularly smaller than that of the base resin material. The overall linear expansion coefficient of the collimator lens barrel 8 is controlled by, for example, increasing the content of the filler F to reduce the overall linear expansion coefficient. More specifically, the filler material may be carbon fibers, glass fibers and other inorganic filler material which can change the linear thermal expansion coefficient of the base resin material. In this embodiment, the base resin material is PES, and the filler F is a magnetic filler such as ferrite particles or the like to provide the magnetic property with the collimator lens barrel 8.

In the laser unit in this embodiment, the linear expansion coefficient of the barrel 8 is so determined as to accommodate the difference in the thermal expansions, more particularly a sum of the thermal expansions $\Delta L1$ and $\Delta L2$ of the first and second holders 7 and 9 for a proper temperature change range $\Delta t$ - the thermal expansion $\Delta L4$ of the chip base 21. The content of the filler F is controlled so as to provide such a linear thermal expansion coefficient. By doing so, the change $\Delta X$ of the gap G by the temperature change can be within the depth of focus of the collimator lens 5, and therefore, the accuracy of the gap G can be assured. This can eliminate the necessity of the temperature controlling element such as Peltier element, a heater or the like for the purpose of assuring the accuracy of the gap G.

Data of experiments will be described when the first and second holders 7 and 9 are made of zinc die-cast; the chip base 21 is made of copper; and the collimator lens barrel 8 is made of a compound material of PES and ferrite particle materials.

The change $\Delta X$ in the gap G is $$\Delta X = [(\alpha_1 L_1 + \alpha_2 L_2) - (\alpha_3 L_3 + \alpha_4 L_4)]\Delta t$$

where $\alpha_1$, $\alpha_2$, $\alpha_3$ and $\alpha_4$ are linear thermal expansion coefficients of the first holder 7, the second holder 9, the collimator lens barrel 8 and the chip base 21.

The dimensions, the linear expansion coefficients and the temperature change range were:

| | |
|---|---|
| $L_1 =$ | 1.7 mm |
| $L_2 =$ | 9.3 mm |
| $L_3 =$ | 6.8 mm |
| $L_4 =$ | 2.55 mm |
| $\alpha_1 =$ | $\alpha_2 = 2.74 \times 10^{-5}$ (1/°C.) |
| $\alpha_3 =$ | $3.8 \times 10^{-5}$ (1/°C.) |
| $\alpha_4 =$ | $1.65 \times 10^{-5}$ (1/°C.) |

| | -continued |
|---|---|
| $\Delta t =$ | 40 °C. |
| Then, | |
| $\Delta X =$ | $[2.74 \times (1.7 + 9.3) - (3.8 \times 6.8 + 1.65 \times 2.55)]$ |
| $\times$ | $10^{-5} \times 40 = 0.000037$ (mm) |
| $=$ | 0.037 (micron) |

Figure 4:
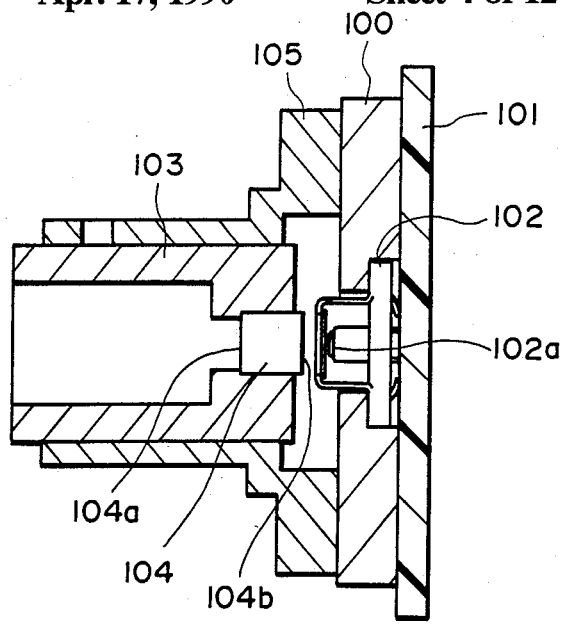
FIG. 4 is an example of a laser unit not using the present invention.

Generally, the tolerance of the gap change ($\Delta X$) is approximately 2 microns to provide a desired beam shape. In the example shown in FIG. 4, where the first and second holders 100 and 105 are made of aluminum die-cast, the chip base is made of copper; and the collimator lens barrel 103 is made of steel; and the therefore, the linear expansion coefficient $\alpha_1'$, $\alpha_2'$, $\alpha_3'$ and $\alpha_4'$ thereof are $$\alpha_1' = \alpha_2' = 2.39 \times 10^{-5} \text{ (1/°C.)}$$

$$\alpha_3' = 1.17 \times 10^{-5} \text{ (1/°C.)}$$

$$\alpha_4' = 1.65 \times 10^{-5} \text{ (1/°C.)}$$

Assuming the dimensions $L_1$–$L_4$ are the same, the gap change $\Delta X$ is $$\Delta X = [2.39 \times (1.7 + 9.3) - (1.17 \times 6.8 + 1.65 \times 2.55)] \times 40$$
$$= 40 = 0.0057 \text{ (mm)} = 5.7 \text{ (microns)}$$

The gap change $\Delta X$ exceeds the tolerance of $\pm 2$ microns.

In order to reduce the gap change $\Delta X$ within the tolerance, the dimensions of the various parts have to be adjusted since the linear expansion coefficient are constant. Therefore, the latitude in the design is limited, and the material of the various parts are limited. If the adjustment is not sufficient only by the dimensions, the tolerable temperature change has to be reduced, and the temperature change range under which the laser unit is used, is beyond the tolerable temperature change, the temperature control means is necessitated.

According to the present invention, however, the linear expansion coefficient $\alpha_3$ of the collimator lens barrel 8 made of a resin material can be changed, so that the amount of thermal expansion $\Delta X$ of the gap G can be within the tolerable range, and therefore, the configurations and dimensions of the first and second holders 7 and 9 or the like can be more freely selected, and also, the latitude for the selection of the material can be increased. Also, the tolerable temperature change $\Delta t$ can be expanded without the necessity of the temperature control means.

In this embodiment, the collimator lens barrel 8 is made of resin material. However, as an alternative, the other member or members such as first and second holders 7 and 9 may be made of the resin material. Plural members may be made of resin materials. In the structure of this embodiment, however, the dimension L3+L4 of the collimator lens barrel 8 and the chip base 10 expanding by heat to decrease the gap G is smaller than the dimensions L1+L2 of the first and second holders 7 and 9 expanding to increase the gap G, and therefore, the gap G tends to expand when the temperature rises. Accordingly, the change of the gap G is most efficiently accommodated when the collimator lens barrel 8 is made of a resin material having a large linear thermal expansion coefficient. The materials of the other elements or members are not limited to metals, but the second holder 9, for example, may be made of resin material or the like. In this embodiment, the collimator lens barrel 8 is supported by the second holder 9, and therefore, the linear expansion coefficient of the collimator lens barrel 8 is required to be higher than that of the second holder 9, and therefore, it is preferable that only the collimator lens barrel 8 is made of resin material.

In this embodiment, the first and second holders 7 and 9 are made of zinc die-cast, but it may be made of aluminum or other material. However, the zinc die-cast is advantageous in that it is good in the manufacturing accuracy, without the necessity of finishing treatment so that the manufacturing cost is low.

Figure 9:
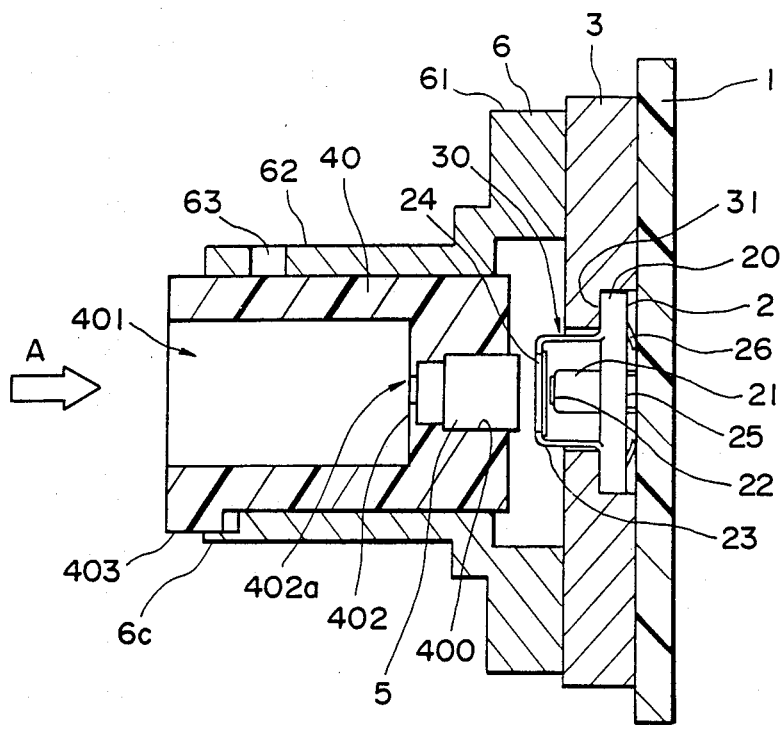
FIG. 9 is a sectional view of a laser unit according to a further embodiment of the present invention.
Figure 10:
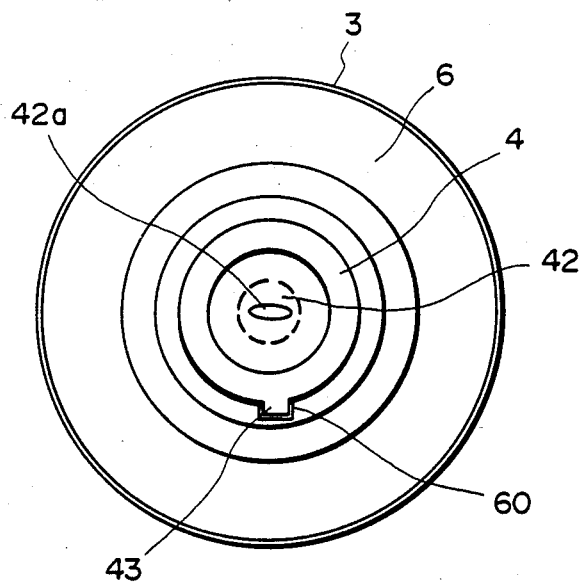
FIG. 10 is a front view of the laser unit of FIG. 9.

Referring to FIGS. 9 and 10, a further embodiment of the present invention will be described, wherein a collimator lens barrel is designated by a reference numeral 40, which supports the collimator lens 5 made of glass. The collimator lens barrel 40 is made of resin material to permit easy integral molding. The resin material is, in this embodiment, PES (polyethersulfone material). Another example of the resin material is PPS (polyphenylenesulfide material). The barrel 40 is provided, at its longitudinal end, more particularly, at an emitting chip 22 side end, with a cylindrical recess 400 for concentrically fixing the collimator lens 5. It is also provided with a cylindrical recess 401 extending from the neighborhood of the center thereof to the other end thereof, the recess 401 having a diameter larger than that of the recess 400 to allow the laser beam to pass. Between the recesses 400 and 401, an aperture stop 42 is integrally formed to confine the laser beam into a desired spot.

FIG. 10 is a view of the laser unit LU seen in a direction indicated by an arrow A in FIG. 9, that is, the direction opposite to the emission of the laser beam. As will be understood from FIG. 10, the aperture 402a of the aperture stop 402 is substantially oval having a horizontal major axis. The length of the major axis is smaller than the inside diameter of the recess 400. The configuration of the aperture 402 is not limited to the oval, but may be, for example, circular, a rotation-symmetrical shape or non-rotation-symmetrical shape. The reason why the opening of the aperture stop 402 is made oval in this embodiment is that when the laser beam is formed into a spot on the surface of the photosensitive drum C which will be described hereinafter, the resolution in the beam scanning direction is increased.

As shown in FIGS. 9 and 10, at a part of the outer periphery of the collimator lens barrel 40 at the open end, a stopper 403 in the form of a square projection is integrally formed, and it functions as an engaging portion for preventing rotation of the barrel 40 in the barrel holder 6. The stopper 403 is engaged with an engaging slot 60 having a corresponding configuration and formed at a predetermined position in an inside periphery of the barrel holder 6.

Figure 11:
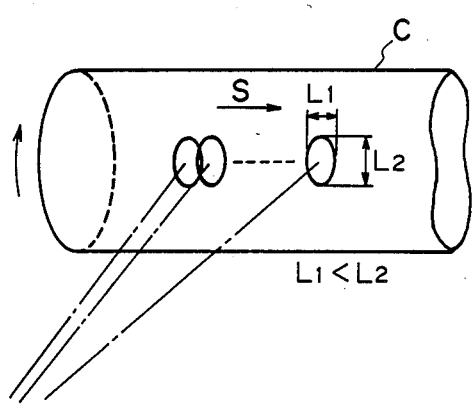
FIG. 11 is a perspective view illustrating projection of a laser beam onto a photosensitive member, using the laser unit shown in FIGS. 9 and 10.

When the laser unit LU is used as a beam source for exposing a photosensitive member, as shown in FIGS. 2 and 3, it is desirable in order to increase the resolution of the image that the cross section of the beam projected onto the surface of the drum C is longer in the vertical direction when the beam is deflected in a horizontal scanning direction S. In view of this, the shape of the aperture 402a of the aperture stop 402 is made oval, so that as shown in FIG. 11, a beam spot 9 having a major axis (L1) and a minor axis (L2) is formed on the photosensitive drum C according to the laser unit LU of the present embodiment It is known that when the beam emitted from the laser unit LU has a cross section of oval form having a major axis in the direction parallel to the beam scanning plane, the beam projected onto the drum through the cylindrical lens SL, the polygonal mirror PM and the toric lens L has an oval cross section having a major axis in the direction of the drum rotation. Therefore, the major axis of the oval beam spot on the surface of the photosensitive drum C has to extend perpendicular to the scanning direction S. For this reason, as shown in FIG. 10, a laser beam having a cross section with a longer horizontal axis is produced by disposing the stopper 43 and the engagement slot 60 on an extension of a minor axis 42a of the oval opening of the collimator lens barrel 4.

As described, in the foregoing, the collimator lens barrel 4 is made of resin material such as PES resin, and therefore, it is easy to manufacture into a desired form, and a small aperture stop 42 can be easily formed integrally in the lens barrel 4. Therefore, when the laser recording apparatus using the laser unit LU according to this embodiment is assembled, it is not necessary to assemble separately the aperture stop. This reduces the number of constituent parts, and simultaneously, the process of correctly positioning it can be omitted, thus reducing the cost of the device.

Also, since the aperture stop 402 is integrally formed in the collimator lens barrel 40, the aperture stop 402 can be correctly positioned relative to the optical axis of the laser beam, thus correctly confining the laser beam. Because of this, when it is used with a laser recording apparatus, a high quality images can be produced.

Since, in this embodiment, the opening 402a of the aperture stop 402 is made oval, the resolution is increased when an image is formed on the photosensitive drum C, particularly when the image is formed by background scan wherein the non-image portion (background portion) is exposed to the beam.

Also since there are provided in this embodiment a stopper 403 in the collimator lens barrel 40 and since the barrel holder 6 is provided with an engagement slot 60 engageable with the stopper 403, the opening 402a can be angularly correctly positioned relative to the laser beam during manufacturing of the unit, so that the angle of the oval or the like spot is correct on the surface of the photosensitive drum C, and therefore, the resolution is high. In addition, even when the opening of the aperture stop 402 is circular, the rotation of the collimator barrel 40 is prevented during manufacturing, so that the optical axis of the collimator lens 5 is prevented from deviating. Therefore, the laser beam can be correctly emitted.

In this embodiment, only the collimator lens barrel 4 is made of resin material such as PES material, but the barrel holder 6 may be made of a resin material such as the PES resin, too. In this case, the formation of the engagement slot 60 is easier since the resin is easy to processing. However, if the consideration is made to the change of the gap between the collimator lens 5 and the beam emitting chip 22 due to temperature change and to the radiation effect for the heat produced by the laser emission, it is preferable that only the collimator lens barrel 40 is made of a resin material.

Figure 15:
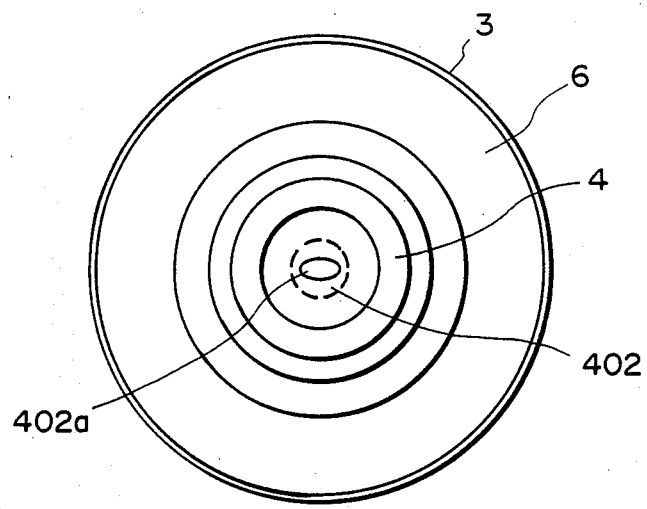
FIG. 15 is a front view of a laser unit according to a further embodiment of the present invention.

Referring to FIG. 15, there is shown a further embodiment wherein only the aperture stop having an oval shape is integrally formed with the collimator lens barrel. Since there is a liability of rotation of the collimator lens barrel during manufacturing of the laser unit, the provision of the stopper is preferable, particularly, the provision of the stopper integrally formed with the barrel, and therefore, with the aperture stop is preferable.

Further embodiment will be described. In this embodiment shown in FIG. 5, a filler material is mixed into the resin material of the collimator lens barrel. In the present embodiment, the flow of molecules of the filler material mixed thereinto is given a directivity to further stabilize the thermal expansion. The linear expansion coefficient is different depending on the direction of the flow of the molecules of the resin and the directivity of the filler material F. Table 1 shows linear expansion coefficients in the direction MD of the flow of the resin and in the direction perpendicular thereto (TD) of various resin materials added with various filler materials.

TABLE 1

| RESIN | FILLER | LINEAR EXPANSION COEFFICIENT (MD) (1/°C.) | LINEAR EXPANSION COEFFICIENT (TD) (1/°C.) |
|---|---|---|---|
| PES | Inorganic Filler | $2.3 \times 10^{-5}$ | $5.2 \times 10^{-5}$ |
| PES | Ferrite (50 wt. %) | $3.8410 \times 10^{-5}$ | $4.0 \times 10^{-5}$ |
| PES | Ferrite (60 wt. %) | $3.6 \times 10^{-5}$ | $3.7 \times 10^{-5}$ |
| PES | Inorganic Filler + Ferrite (50 wt. %) | $3.0 \times 10^{-5}$ | $3.5 \times 10^{-5}$ |
| PES | None | $5.5 \times 10^{-5}$ | $5.7 \times 10^{-5}$ |

In this embodiment, the directions of the filler F and the flow of the molecules of the resin are substantially perpendicular to the axis of the collimator lens barrel 8, and the linear expansion coefficient $\alpha_{3R}$ in the radial direction of the collimator barrel 8 is smaller than a linear expansion coefficient $\alpha_{3Th}$ in the longitudinal direction ($\alpha_{3R} < \alpha_{3Th}$).

Figure 12A:
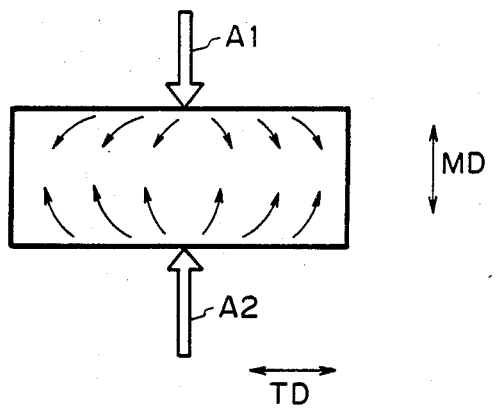
FIGS. 12A, 12B, 12C, 13A and 13B illustrate injection of resin and filler materials.

FIG. 12A shows an example of formation of the above described collimator lens barrel 8. The collimator lens barrel 8 is formed by injection molding or transfer molding, in which the directivities of the flow of the resin and the filler material F are determined by the direction of the flow of the melted resin material injected into the cavity of the mold. In this embodiment, two gates A1 and A2 for resin injection are provided adjacent the center of the lens barrel 8 to be opposed to each other, wherein the directions of the injection are perpendicular to the center axis of the collimator lens barrel 8. Three or more gates may be provided in the circumferential direction. The resin material injected into the cavity through the gates A1 and A2 are expanded toward longitudinal opposite ends and also in the circumferential directions, and the resin material injected through the gates A1 and A2 are merged with each other to be directed outwardly in the radial direction. In this manner, the direction of the flow of the resin material becomes perpendicular to the central axis of the collimator lens barrel 8.

Figure 12B:
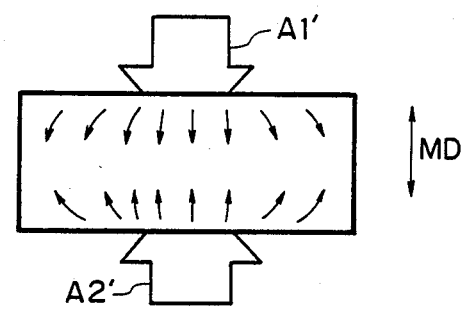
Figure 12C:
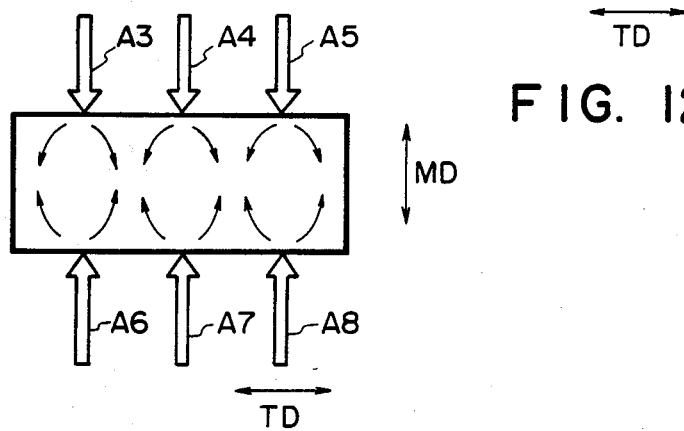

The gates for injection of the resin material are in the form of a pin gate in the example of FIG. 12A, but they may be in the form of a gate A1' or A2' having a certain width in the longitudinal direction as shown in FIG. 12B, or may be in the form of plural gates A3, A4 ... A8 arranged in the longitudinal direction shown in FIG. 12C, by which the directivity of the resin flow ca be made uniform in the direction perpendicular to the axis.

Since the directivity of the resin and the filler F in the body of the collimator lens barrel 8 is made perpendicular to the axis of the collimator lens barrel 8, the linear expansion coefficient $\alpha_{3R}$ in the direction perpendicular to the axis is smaller than that in the axial direction, so that the amount of thermal expansion of the collimator lens barrel 8 is limited in the perpendicular direction as compared with the axial direction. Therefore, the collimator lens barrel 8 expands relatively greatly in the axial direction in response to the temperature change of the collimator lens barrel 8 in the axial direction to compensate the gap G change, and simultaneously, the expansion in the radial direction is limited. As a result, the thermal stress produced in the engagement portion between the collimator lens barrel 8 and the second holder 9 and in the collimator lens 4 holding portion in the collimator lens barrel 8 can be minimized, and simultaneously, the possible strain of the collimator lens 4 can be avoided. Also, the collimator lens barrel 8 and the collimator lens 4 are prevented from coming off due to the thermal expansion.

Making the direction of the flow of the molecules of the filler material and the resin material substantially perpendicular to the optical axis is particularly effective when a large amount of thermal expansion of the collimator lens barrel is required.

On the contrary, when the amount of the thermal expansion of the collimator lens barrel should be small, the direction of the molecules of the resin and filler material is preferably substantially parallel with the optical axis. By doing so, the thermal expansion of the barrel 8 in the direction of the axis is most prevented, since the linear thermal expansion coefficient in the direction of the axis greatly decreases. As will be understood from Table 1, the linear expansion coefficient in the direction MD is smaller than that in the detection TD, and small amount of the filler F is sufficient to greatly decrease the linear expansion coefficient.

The directivity of the filler F is, when the filler F is in the form of fibers such as carbon fibers or glass fibers, the direction of the fibers, which are codirectional with flow of the resin material. Similarly, in the case of the ferrite particles, they are flown in the direction of the flow of the resin material.

Figure 13A:
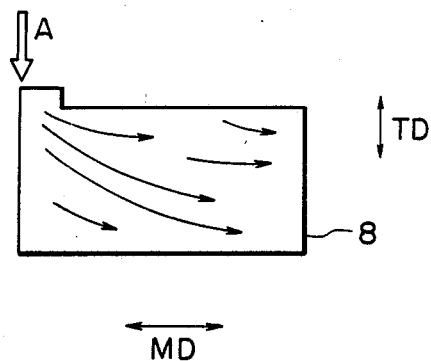

FIG. 13A shows an example of molding of the collimator lens barrel 8. The barrel 8 is produced by injection molding and a transfer molding, wherein the directivity of the filler F and the flow of the resin material is determined by the direction of the flow of the melted resin material injected into the cavity. The flow direction is determined by the position or positions of the gate. In FIG. 13A, a gate A is disposed adjacent an end of the collimator lens barrel 8, and the resin material is injected in the direction perpendicular to the central axis. The resin material injected into the cavity through the gate A flows toward the other end of the barrel 8 while expanding in the circumferential direction, and the filler flows along lines of flow of the resin material.

Figure 13B:
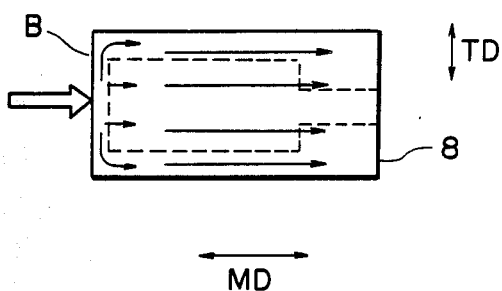

In FIG. 13B, a gate is in the form of a disk gate B and is disposed adjacent one end of the collimator lens barrel 8. In this example, the resin material flows from the end of the cylindrical lens barrel 8 uniformly in the axial direction, and therefore, the directivity of the filler material can be made more uniform.

Figure 5:
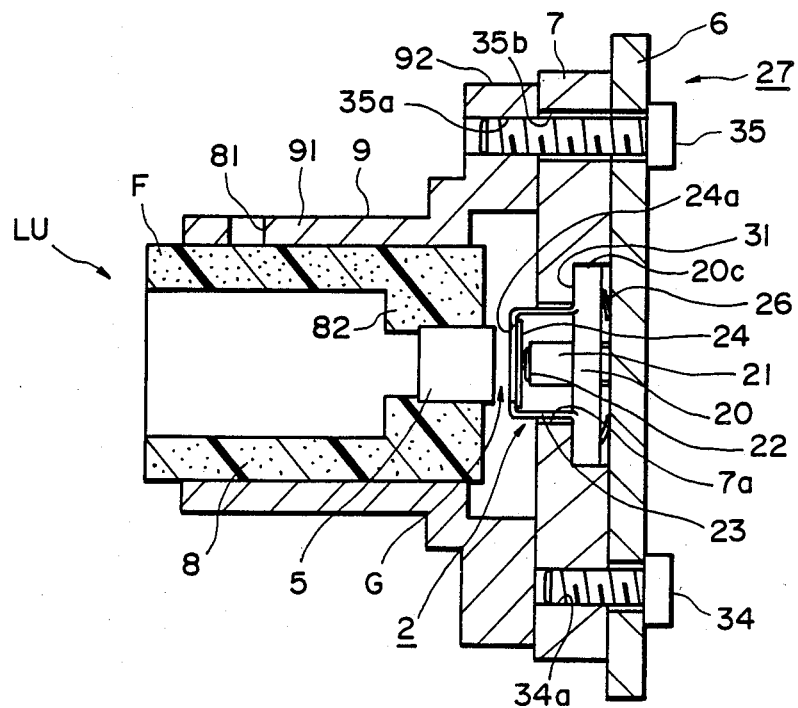
FIG. 5 is a sectional view of a laser unit according to another embodiment of the present invention.

In the embodiment of FIG. 5, the filler F is ferrite particles which is magnetic. By the magnetic material mixed in the collimator lens barrel, the lens barrel 8 is magnetically attractable.

Figure 14:
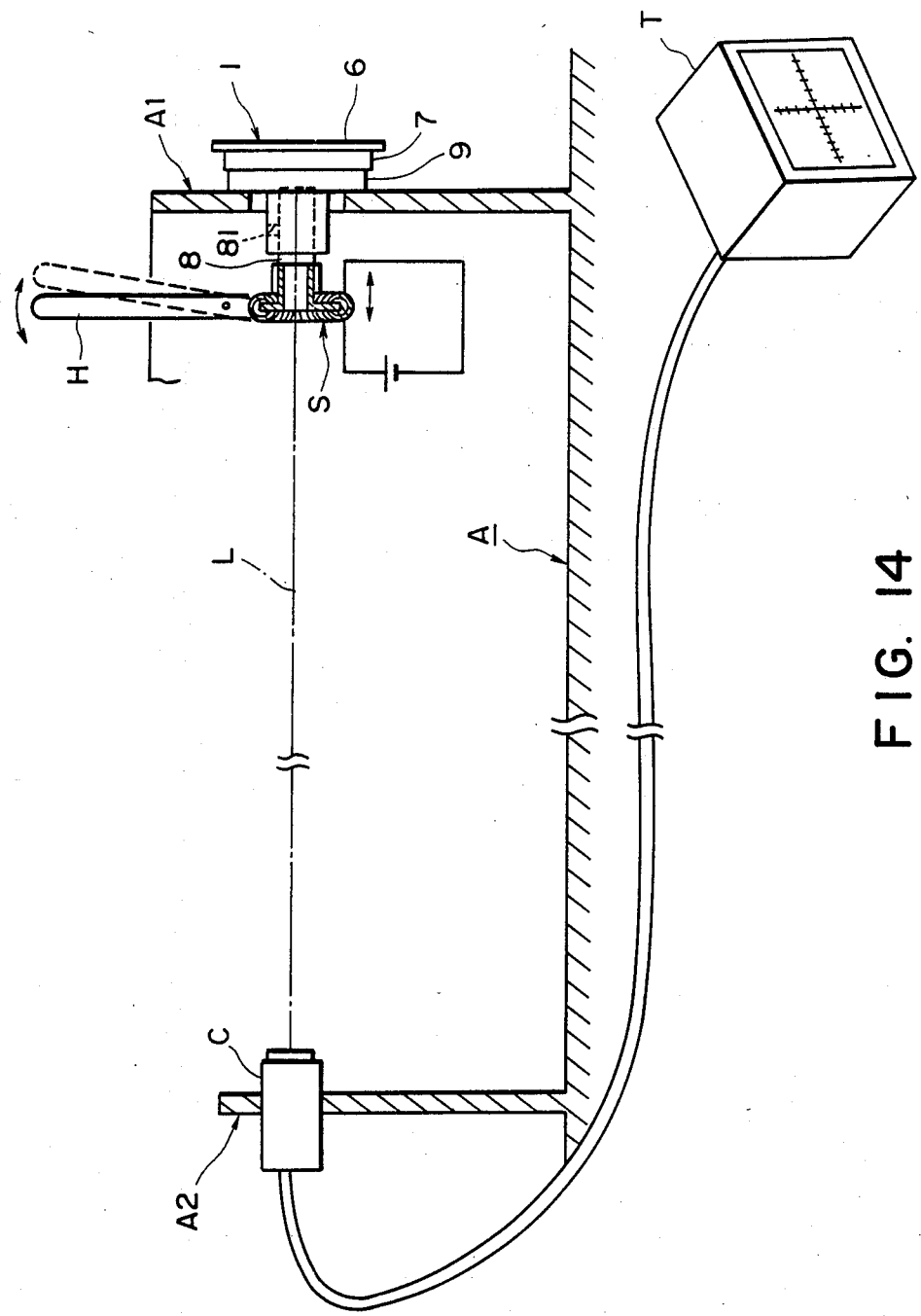
FIG. 14 is a sectional view illustrating adjustment of a gap between the laser chip and the collimator lens.

FIG. 14 illustrates an embodiment wherein the gap between the collimator lens and the laser chip is adjusted using magnetic force. In this embodiment by the first holder 7 and the spring washer 26, the emission angle of the laser beam L is defined, and by the second holder 9, the laser chip 22 and the collimator lens 5 are coaxially aligned, before it is mounted to an adjusting base A. The adjusting base A is provided with a laser mount A1 for mounting the laser unit 1 and a camera mount A2 spaced from the laser unit 1 by a predetermined distance, wherein a laser unit 1 and the CCD camera C are aligned in a line. A cross-section of the laser beam L received by the CCD camera C is displayed on a monitor TV T connected to the CCD camera C, by which the gap G is finely adjusted.

As a means for gripping the collimator lens barrel 8, a lever H having at its end an electromagnet S is used. When the electromagnet S is energized, the collimator lens barrel 8 is attracted. Then, the lever H is pushed or pulled to shift the collimator lens barrel 8 in the direction of the optical axis to adjust the gap G. The confirmation of the adjustment is made using the monitor TV connected with the CCD camera C to search the best beam position. When the spot diameter of the laser beam L becomes a predetermined, an instant bonding agent is supplied through the bonding bore 81 formed in the second holder 9 to securedly fix the collimator lens barrel 8 to the second holder 9. After they are completely secured, the electromagnet S is deenergized, and the lever H is removed. Subsequently, the laser unit 1 is dismounted from the adjusting base A.

If the ambient conditions under which the adjustment is performed is significantly different from usual conditions under which the laser unit is used, it is possible in order to accurately adjust it that a small amount of deviation is given deliberately from the best focus position by a small amount calculated out to reduce the defocus due to the temperature change.

By constituting the collimator lens barrel with a resin material containing the magnetic material, the position adjustment of the collimator lens barrel can be performed using the magnetic force.

However, in order to increase the magnetic property of the barrel, it is required to increase the content of the magnetic material. This can result in improper matching with the thermal expansion.

Figure 16:
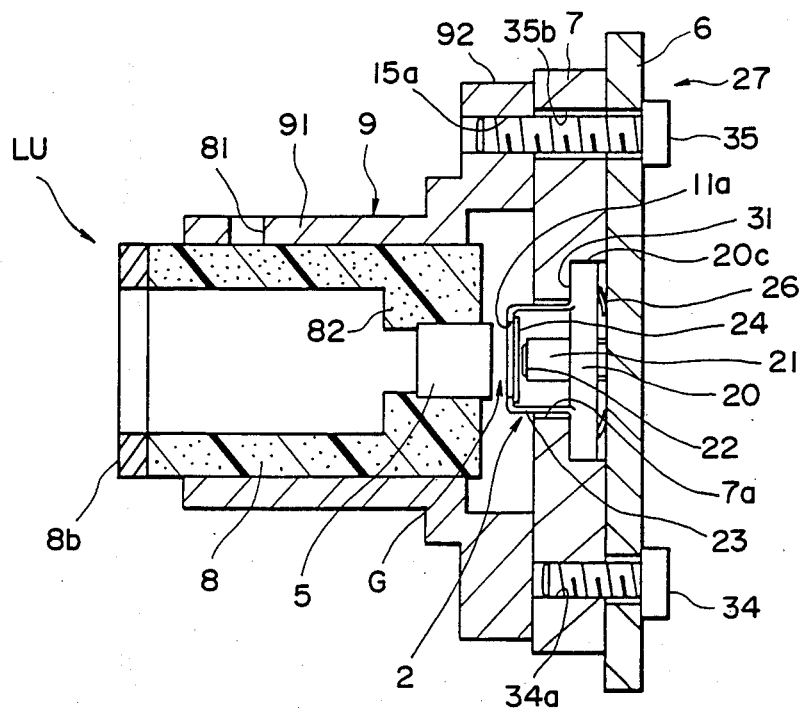
FIG. 16 is a sectional view of a laser unit according to a further embodiment of the present invention.

FIG. 16 shows an embodiment wherein this problem is solved. The collimator lens barrel 8 of this embodiment is similarly made of a resin material. However, it is provided at a longitudinal end remote from the laser chip 22 with a magnetic metal member 8b which is bonded or integrally molded by insert molding.

By the provision of the magnetic metal with the collimator barrel, it is assuredly attracted magnetically irrespective of the amount of the filler material.

While the invention has been described with reference to the structures disclosed herein, it is not confined to the details set forth and this application is intended to cover such modifications or changes as may come within the purposes of the improvements or the scope of the following claims.

What is claimed is:

1. A laser unit, comprising:
    a first unit having a laser source for emitting laser beam, said first unit being made of a high thermal conductivity material to absorb heat from said laser source; and
    a second unit having a collimator lens for collimating the laser beam emitted from said laser source, said second unit having a low thermal conductivity material for thermally insulating the collimator lens from said first unit.

2. A unit according to claim 1, wherein said low thermal conductivity material is made of resin material.

3. A unit according to claim 1, wherein said low thermal conductivity material is of ceramic material.

4. A unit according to claim 1, wherein said low thermal conductivity material constitutes a lens barrel for said collimator lens.

5. A unit according to claim 1, further comprising a supporting member for supporting said first unit, wherein said supporting member is of high thermal conductivity material.

6. A unit according to claim 1, wherein said laser source is in the form of a laser package containing a laser emitting chip and provided with a laser emitting window.

7. A unit according to claim 6, wherein a gap is provided between said laser package and said collimator lens.

8. A unit according to claim 1, wherein the laser beam emitted from said laser unit is deflected by deflecting means to scan a photosensitive member.

9. A laser unit, comprising:
    a laser source for emitting a laser beam;
    a collimator lens for collimating a laser beam emitted from said laser source;
    supporting means for integrally supporting said laser source and said collimator lens with a gap therebetween, said supporting means is at least partly made of resin material, into which filler material is mixed to prevent or reduce change of the gap due to heat.

10. A unit according to claim 9, wherein the filler material has a linear thermal expansion coefficient which is smaller than that of the resin material.

11. A unit according to claim 9, wherein said supporting means includes a lens barrel for accommodating said collimator lens, and wherein the lens barrel is of the resin material.

12. A unit according to claim 9, wherein said laser source is in the form of a laser package containing a laser emitting chip and provided with a laser emitting window.

13. A unit according to claim 9, wherein the laser beam emitted from said laser unit is deflected to scan a photosensitive member.

14. A unit according to claim 9, wherein said supporting means is of zinc die-cast in the portion other than those of resin material.

15. A unit according to claim 9, wherein the direction of the flow of molecules of the resin material and the filler material is substantially perpendicular to the optical axis of the laser beam.

16. A unit according to claim 9, wherein the direction of the flow of molecules of the resin material and the filler material is substantially parallel with the optical axis of the laser beam.

17. A laser unit, comprising:
    a laser source for emitting a laser beam;
    a collimator lens for collimating a laser beam emitted from said laser source;
    a lens barrel for accommodating said collimator lens, wherein said barrel is of resin material and has a integrally molded aperture stop for defining a spot shape provided by the laser beam.

18. A unit according to claim 17, wherein the aperture of the aperture stop is oval.

19. A unit according to claim 18, wherein said barrel is further provided with an integrally molded stopper for preventing rotation of said barrel.

20. A unit according to claim 17, wherein said laser source is in the form of a laser package containing a laser emitting chip and provided with a laser emitting window.

21. A unit according to claim 17, wherein a gap is provided between said laser package and said collimator lens.

22. A unit according to claim 17, wherein the laser beam emitted from said laser unit is deflected b deflecting means to scan a photosensitive member.

23. A laser unit, comprising:
a laser source for emitting a laser beam;
a collimator lens for collimating the laser beam emitted from said laser source; and
a lens barrel for accommodating said collimator lens, the barrel being of an insulative member into which magnetic material is added.

24. A unit according to claim 23, wherein said insulating member is made of resin material.

25. A unit according to claim 2, wherein said heat insulating member is of ceramic material.

26. A unit according to claim 23, wherein a longitudinal end of said lens barrel remote from said laser source is magnetically attractable.

27. A unit according to claim 23, wherein the filler material is ferrite particles.

28. A unit according to claim 23, wherein said laser source is in the form of a laser package containing a laser emitting chip and provided with a laser emitting window.

29. A unit according to claim 23, wherein a gap is provided between said laser package and said collimator lens.

30. A unit according to claim 23, wherein the laser beam emitted from said laser unit is deflected by deflecting means to scan a photosensitive member.

31. A unit according to claim 23, further comprising a holder having an accommodating portion extending in a direction of an optical axis to accommodate said lens barrel.

32. A laser unit, comprising:
a laser source for emitting a laser beam;
a collimator lens for collimating the laser beam emitted from said laser source;
a lens barrel for accommodating said collimator lens, the lens barrel being of heat insulative material; and
magnetic metal member fixed to said lens barrel of the heat insulative material.

33. A unit according to claim 32, wherein the magnetic metal member is fixed to a longitudinal end of said lens barrel remote from said laser source.

34. A unit according to claim 32, wherein magnetic material is fixed into the heat insulative material.

35. A unit according to claim 32, wherein said insulating member is made of resin material.

36. A unit according to claim 32, wherein said heat insulating member is of ceramic material.

37. A unit according to claim 32, wherein said laser source is in the form of a laser package containing a laser emitting chip and provided with a laser emitting window.

38. A unit according to claim 32, wherein a gap is provided between said laser package and said collimator lens.

39. A unit according to claim 32, wherein the laser beam emitted from said laser unit is deflected by deflecting means to scan a photosensitive member.

40. A unit according to claim 32, further comprising a holder having an accommodating portion extending in a direction of an optical axis to accommodate said lens barrel.

41. A unit according to claim 40, wherein said lens barrel is bonded and fixed to the accommodating portion.

* * * * *

UNITED STATES PATENT AND TRADEMARK OFFICE
CERTIFICATE OF CORRECTION

PATENT NO. : 4,918,702

DATED : April 17, 1990

INVENTOR(S) : AKIYOSHI KIMURA

It is certified that error appears in the above-identified patent and that said Letters Patent is hereby corrected as shown below:

COLUMN 3

Line 53, "ga" should read --gap--.

COLUMN 4

Line 50, "between" should read --between a--.

COLUMN 8

Line 13, "the" should be deleted.

COLUMN 12

Line 1, "ca" should read --can--.

UNITED STATES PATENT AND TRADEMARK OFFICE
CERTIFICATE OF CORRECTION

PATENT NO. : 4,918,702
DATED : April 17, 1990
INVENTOR(S) : AKIYOSHI KIMURA

It is certified that error appears in the above-identified patent and that said Letters Patent is hereby corrected as shown below:

COLUMN 15

Line 17, "b" should read --by--.
Line 28, "claim 2," should read --claim 23,--.

Signed and Sealed this

Thirty-first Day of December, 1991

Attest:

HARRY F. MANBECK, JR.

Attesting Officer     Commissioner of Patents and Trademarks